(12) United States Patent
Kiziloglu et al.

(10) Patent No.: US 6,916,720 B2
(45) Date of Patent: Jul. 12, 2005

(54) THIN FILM DEVICES AND METHOD FOR FABRICATING THIN FILM DEVICES

(75) Inventors: Kursad Kiziloglu, Los Angeles, CA (US); Charles H. Fields, Malibu, CA (US); Adele E. Schmitz, Newbury Park, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 97 days.

(21) Appl. No.: 10/190,223

(22) Filed: Jul. 5, 2002

(65) Prior Publication Data

US 2002/0182818 A1 Dec. 5, 2002

Related U.S. Application Data

(62) Division of application No. 09/436,662, filed on Nov. 10, 1999, now abandoned.

(51) Int. Cl.$^7$ .............................................. H01L 21/20
(52) U.S. Cl. ...................... 438/382; 438/384; 438/712; 438/745
(58) Field of Search .................. 438/382, 384, 438/712, 745, 706, FOR 220; 430/311

(56) References Cited

U.S. PATENT DOCUMENTS

| 4,076,860 | A |   | 2/1978 | Kuroda .......................... 427/91 |
|---|---|---|---|---|
| 4,560,435 | A |   | 12/1985 | Brown et al. ................ 156/643 |
| 5,227,012 | A |   | 7/1993 | Brandli et al. ............... 156/643 |
| 5,422,307 | A | * | 6/1995 | Ishii ............................ 438/384 |
| 5,525,831 | A |   | 6/1996 | Ohkawa et al. .............. 257/543 |
| 5,554,865 | A |   | 9/1996 | Larson ......................... 257/275 |
| 5,625,218 | A |   | 4/1997 | Yamadera et al. ........... 257/529 |
| 5,684,308 | A |   | 11/1997 | Lovejoy et al. .............. 257/184 |
| 5,751,050 | A |   | 5/1998 | Ishikawa et al. ............. 257/538 |
| 5,976,944 | A | * | 11/1999 | Czagas et al. ............... 438/382 |
| 6,034,411 | A |   | 3/2000 | Wade et al. .................. 257/536 |
| 6,081,014 | A |   | 6/2000 | Redford et al. .............. 257/359 |
| 6,096,591 | A | * | 8/2000 | Gardner et al. .............. 438/238 |
| 6,130,170 | A | * | 10/2000 | David et al. ................. 438/745 |
| 6,461,978 | B1 | * | 10/2002 | Jo ................................ 438/754 |

FOREIGN PATENT DOCUMENTS

| EP | 0 374 036 A2 | 6/1990 |
|---|---|---|
| JP | 3 87026 | 4/1991 |
| JP | 03280552 | 12/1991 |
| JP | 09280552 | 12/1991 |
| JP | 05021467 | 1/1993 |
| JP | 09 205081 | 8/1997 |
| JP | 09 205081 | 3/1999 |

OTHER PUBLICATIONS

Stanchina, W.E., "An InP–Based HBT for High–Speed Digital, Analog, Mixed–Signal and Optoelectronic ICS" (1995) IEEE, pp. 31–34.

Lovejoy, M.L., "Thin–film tantalum–nitride resistor technology for phosphide–based optoelectronics" (1996) Elsevier Science S.A., pp. 513–517.

* cited by examiner

Primary Examiner—George Fourson
Assistant Examiner—Michelle Estrada
(74) Attorney, Agent, or Firm—Gates & Cooper LLP

(57) ABSTRACT

A method for making a thin film device on integrated circuits including the steps of applying a first photoresist layer to a first surface, and patterning the first photoresist layer to have at least a first opening that exposes the first surface. A film is deposited onto the first photoresist layer, wherein a portion of the deposited film is deposited onto the exposed first surface. A second photoresist layer is applied onto the deposited layer, wherein the second photoresist layer is applied to the portion of the deposited film within the first opening and covers a second portion of the deposited layer, wherein the first photoresist layer and the second photoresist layer assist in the defining of the deposited layer. The deposited layer, first photoresist layer, and second photoresist layer are selectively removed, therein exposing the first surface and the second portion of the deposited layer.

16 Claims, 6 Drawing Sheets

THIN FILM DEVICES AND METHOD FOR FABRICATING THIN FILM DEVICES

CROSS REFERENCE TO RELATED APPLICATIONS

This application is a divisional of U.S. patent application Ser. No. 09/436,662, entitled "THIN FILM DEVICES AND METHOD FOR FABRICATING THIN FILM DEVICES," by Kursad Kiziloglu, Charles H. Fields, and Adele E. Schmitz, filed Nov. 10, 1999, now abandoned, which application is hereby incorporated by reference herein.

BACKGROUND OF THE INVENTION

1. Field of the Invention.

The present invention relates to devices and methods for making semiconductor devices, and in particular to a thin film device and method for fabricating a thin film device.

2. Description of the Related Art.

Present Integrated Circuit (IC) technologies allow for the creation of very high speed and high-performance circuits through the use of High Electron Mobility Transistors (HEMT) as well as Heterojunction Bipolar Transistor (HBT) technology. However, the HEMT and HBT IC technologies cannot readily use fabrication techniques that are required for other desired IC components. For example, techniques to make thin film resistors are currently not compatible with HEMT and HBT fabrication techniques.

A related art discussed in "An InP-based HBT fab for high-speed digital, analog, mixed-signal, and optoelectronics ICs," W. E. Stanchina, J. F. Jensen, R. H. Walden, M. Hafizi, H. C. Sun, T. Liu, G. Raghavan, K. E. Elliott, M. Kardos, A. E. Schmitz, Y. K. Brown, M. E. Montes, M. Yung, in 1995 GaAs IC Symposium Technical Digest, pp. 31–34, which is incorporated by reference herein, describes the methodology of fabricating HBT based ICs. To fabricate a thin film resistor on an HBT, a layer of silicon nitride (SiN) is deposited over the entire wafer to protect other devices from short circuiting. A layer of tantalum nitride (TaN), which is to be used for the thin film resistor, is then sputter deposited over the SiN. A photoresist layer is then patterned through photolithographic techniques. The TaN/SiN is then etched using a Reactive Ion Etch (RIE) technique. To assure complete removal of the underlying SiN layer, overetch of the TaN/SiN is performed, which preferentially undercuts the SiN over the TaN due to the differences in the etch rates. When metal is then evaporated for interconnects, the metal breaks at the undercut between the SiN underlayer and the TaN resistor. The SiN/TaN layers form a stack, or step, and the metallization layer cannot fill in the intersection of the SiN/TaN and surface, which is known as poor step coverage. As such, thin film resistors cannot be readily used as an integrated package with HBT devices.

HEMT devices suffer even greater degradation when combined with thin film resistors because the RIE must etch all deposited layers until the surface of the wafer is reached. Unlike HBTs, HEMTs are lateral, surface sensitive devices. This etch-back would result in direct bombarding of the device active channel and thus the deterioration of HEMTs' electrical characteristics.

FIG. 1A illustrates a tantalum nitride (TaN)/silicon nitride (SiN) resistor stack of the related art. Substrate 10 is shown having a layer 12 attached to substrate 10. Layer 12 is typically SiN. On top of layer 12, layer 14 is coupled. Layer 14 is typically TaN. To couple layer 14 to substrate 10, metallization layer 16 is used.

Since layer 12 is undercut with respect to layer 14 by the RIE etching process, metallization layer 16 must bridge the gap between layers 12 and 14. This gap does not provide proper support for metallization layer 16, and, as such, provides a stress point for metallization layer 16. Further, the height that metallization layer must span from the top of substrate 10 to the top of layer 14 is great (the "height" of the step is large), since layer 12 is sandwiched inbetween layer 14 and substrate 10. These factors lower the yield of devices and provide failure points for devices that survive initial fabrication and burn-in. Further, step coverage for metallization layer 16 is typically poor for devices using a structure as shown in FIG. 1A.

FIG. 1B illustrates a calibrated simulation of the device described in FIG. 1A. The stress point 18 for metallization layer 16 shows a discontinuous metallization layer 16. This occurs because of the void 20 created by the undercutting of layer 12 during the etching process.

A related process is described in "Thin-film tantalum-nitride resistor technology for phosphide-based optoelectronics," M. L. Lovejoy, et al., Thin Solid Films 290–291 (1996), pages 513–517, which is incorporated by reference herein. The process described refers to TaN resistors and formation of TaN resistors without a SiN underlayer.

Another approach to fabricating the thin-film devices is through a liftoff process, as is conventionally done for metallization in ICs. However, thin films, such as TaN, are typically sputter deposited onto the wafer surface as contrasted with conventional metal evaporation, which is done from a "point source." Conventional metal evaporation is a line of sight technique, and liftoff is essentially based on shadowing of the evaporated metal by a retrograde photoresist profile and the breakage of the metal at the edge of the photoresist.

However, since sputter deposition provides very good step coverage, the use of liftoff for sputtered thin films places additional requirements on the photoresist profiles used for liftoff of thin films. Experimental results from liftoff TaN thin film resistors creates edge buildup on the final resistor shape, which is undesired for later processing steps. The liftoff method is therefore expected to be a difficult and expensive task from the point of view of demand for exact photoresist profile optimization and possible lack of repeatability. It can be seen from the foregoing that there is a need in the art for providing thin film devices, such as resistors, that are compatible with HBT and HEMT devices. It can also be seen that there is a need in the art for a method for making thin film devices that do not degrade the HBT and HEMT devices.

SUMMARY OF THE INVENTION

To address the requirements described above, the present invention discloses a thin film device and a method for fabricating film devices that can be used with HBT and HEMT technologies. The present invention is not limited to HBT and HEMT technologies, however, and, as such, provides a thin film device and a method for creating thin film devices in general.

A method in accordance with the present invention comprises the steps of applying a first photoresist layer to a first surface, and patterning the first photoresist layer to have at least a first opening that exposes the first surface. A film is deposited onto the first photoresist layer, wherein a portion of the deposited film is deposited onto the exposed first surface. A second photoresist layer is applied onto the deposited layer, wherein the second photoresist layer is applied to the portion of the deposited film within the first opening and covers a second portion of the deposited layer. The deposited layer, first photoresist layer, and second photoresist layer are selectively removed, therein exposing the first surface and the second portion of the deposited layer.

A device in accordance with the present invention comprises a device formed within a semiconductor structure and a deposited film, coupled to the device. The deposited film is directly coupled to a first surface of a semiconductor wafer, wherein the semiconductor wafer contains the semiconductor structure, and the deposited film is defined by a first photoresist layer and a second photoresist layer. The first photoresist layer limits the coupling of the deposited film to the first surface, and the second photoresist layer defines a pattern of the deposited film.

Thin film devices in accordance with the present invention, and thin film devices fabricated in accordance with the present invention, are compatible with HBT and HEMT devices. Such devices and methods for making these devices provide devices that do not degrade the HBT and HEMT devices.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description, reference is made to the accompanying drawings which form a part hereof, and which is shown, by way of illustration, several embodiments of the present invention. It is understood that other embodiments may be utilized and structural changes may be made without departing from the scope of the present invention.
Overview The present invention incorporates thin film technology with integrated circuit device fabrication, including HEMT and HBT devices. The techniques of the present invention, although discussed with respect to HEMT and HBT devices, are also useful for other integrated circuits, such as bipolar junction transistors (BJTs), field effect transistors (FETs), junction FETs (JFETs), pseudomorphic HEMTs (PHEMTs), and metal-semiconductor FETs (MESFETs).

Figure 2A:
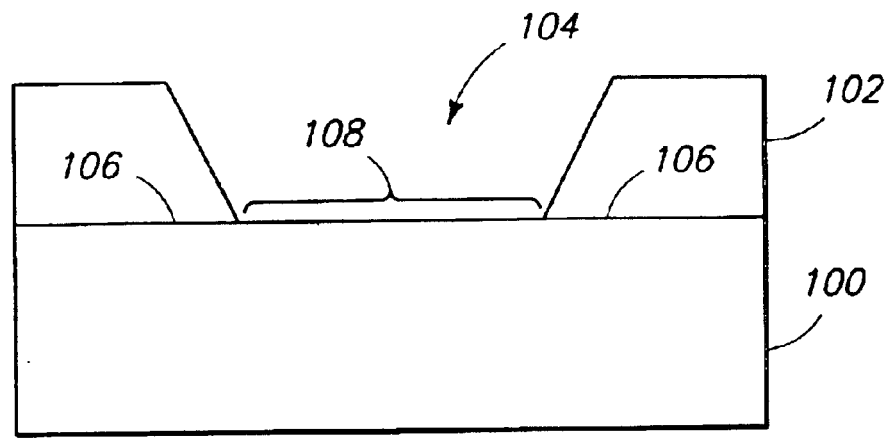
FIGS. 2A–2E illustrate a device fabricated using the steps of the present invention.

FIGS. 2A–2E illustrate a device fabricated using the steps of the present invention. FIG. 2A illustrates first layer 100 of a semiconductor device. Although first layer 100 is shown as a wafer, first layer 100 can be a substrate, a dopant well within a substrate, an isolated structure on top of a layer, a layer or other structure, and is not limited to the single layer structure illustrated in FIG. 2A.

Photoresist layer 102 is applied to first layer 100, and is photolithographically processed to produce an opening 104.

The photolithographic process patterns the photoresist layer 102 by using masks and selective exposure to light, and the photoresist is selectively removed and hardened through a rinse and bake process. Opening 104 can appear in one or many places within photoresist layer 102, and a single opening 104 is shown for ease of illustration. The present invention is not limited to a single opening 104 as shown in FIG. 2A.

The covered areas 106 of first layer 100 can contain devices, such as HEMT and HBT devices, that will be protected by photoresist layer 102. The opening 104 size is not critical, so long as the opening 104 is large enough to accommodate whatever finished device is to be placed within opening 104 on the portion 108 of first layer 100.

Figure 2B:
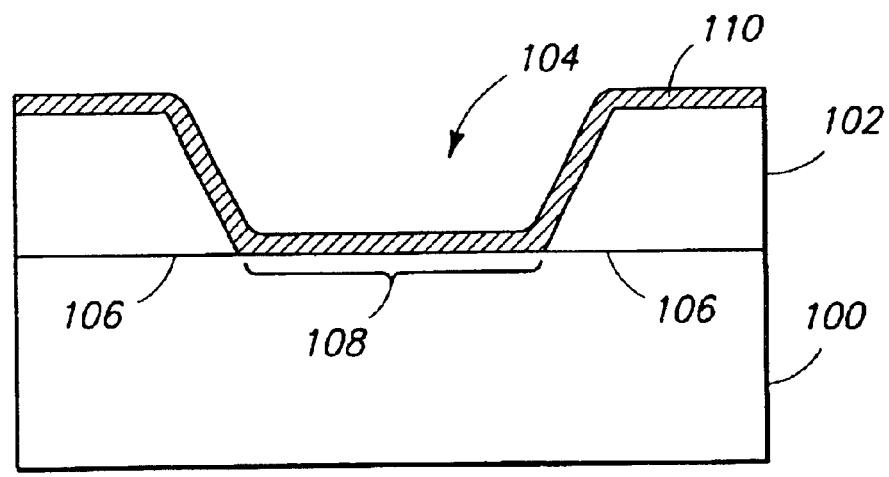

FIG. 2B illustrates a layer 110 deposited on photoresist layer 102 and within opening 104. Layer 110 is typically a thin film layer of tantalum nitride (TaN), but can also be a thin or thick film of other materials such as aluminum, silicon dioxide, nickel chromium, tungsten silicide, tungsten, silicon nitride, other metallizations, or other materials. Layer 110 is deposited using sputtering or other deposition techniques, such as evaporation for metals, plasma-enhanced chemical vapor deposition (PECVD), chemical vapor deposition (CVD), metal organic chemical vapor deposition (MOCVD), or other techniques.

Figure 2C:
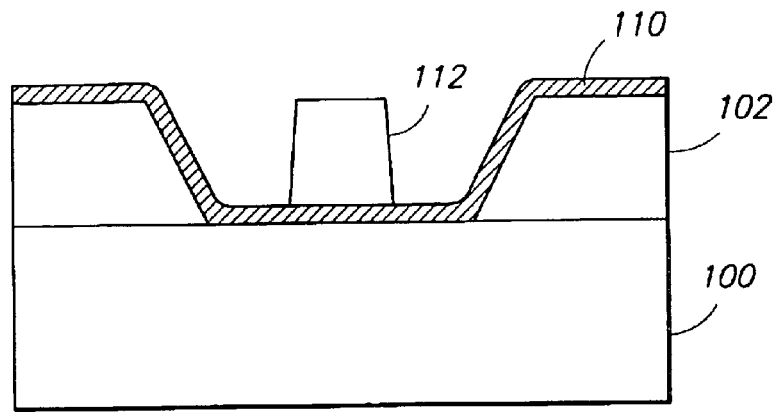

FIG. 2C illustrates a second photoresist layer 112 that has been processed lithographically. Second photoresist layer 112 is used as a pattern defining layer for layer 110. Second photoresist layer 112 is processed as photoresist layer 102 was, using a different mask to produce a different pattern for second photoresist layer 112. Alternatively, the pattern for the second photoresist layer 112 can also be produced by image-reversing and properly shrinking the dimensions of the first mask photolithographically. The mesa structure shown in second photoresist layer 112 defines the pattern for layer 110 by protecting layer 110 during the etching process.

Figure 2D:
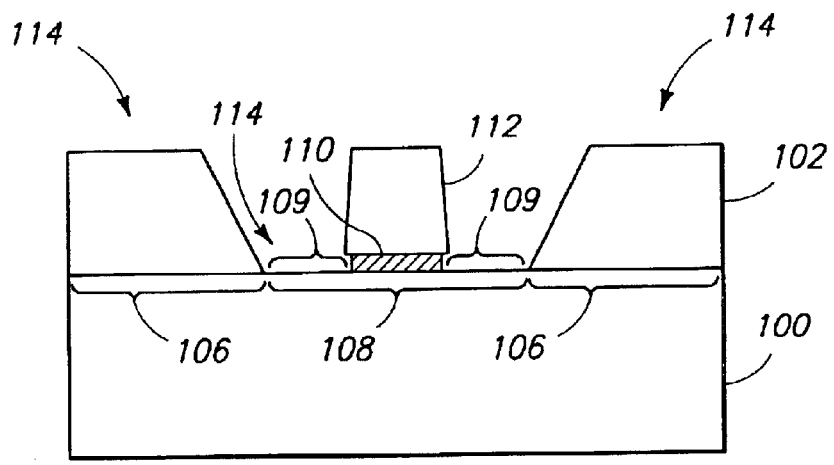

FIG. 2D illustrates etching process 114 that removes the unprotected areas of layer 110. The etching process is typically a Reactive Ion Etch (RIE) process, but can be other processes such as wet etching, photoelectrochemical (PEC) etching, or other removal processes. Etching process 114 removes the layer 110, but not where second photoresist layer 112 protects layer 110. There may be some small undercutting of the second photoresist layer 112 during the etch process 114.

The only areas of first layer 100 that are exposed to the etch process 114 directly are the portions 109 that are not protected by second photoresist layer 112. As such, devices that are resident in areas 106 are protected from damage by photoresist layer 102.

Figure 2E:
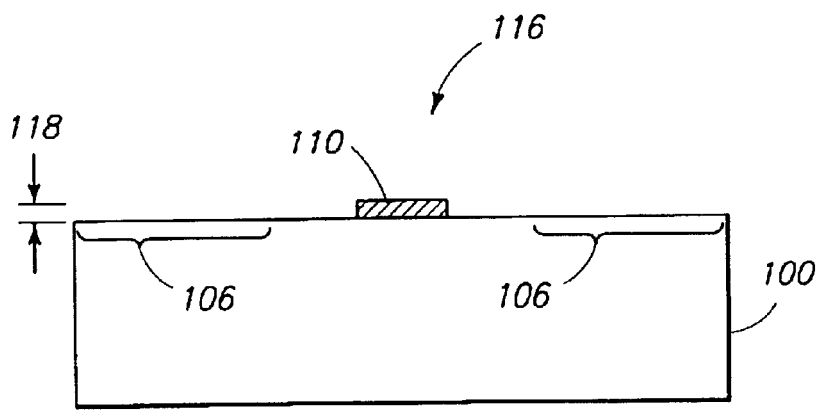

FIG. 2E illustrates a deposited thin film device 116 produced by the present invention. Photoresist layer 102 and second photoresist layer 112 are removed from first layer 100 by an acetone wash, or other wet or dry removal processes. These photoresist removal processes are not harmful to any devices that may be resident in areas 106 on the first layer 100, and, as such, leave device 116 intact in those areas 106. Further, photoresist removal processes do not harm layer 110, and leave layer 110 that was protected by second photoresist layer 112 attached to first layer 100.

The process described in FIGS. 2A–2E allow for creation of thin film devices, such as resistors, to be fabricated without an underlying layer of SiN under layer 110. The underlying layer of SiN would be undercut by etch process 114, and, as such, make metallization contact to layer 110 difficult. The present invention provides a much lower step height 118, as well as a step height 118 that is not undercut, which provides better metallization contact with layer 110.

Further, the present invention refines the related process described in "Thin-film tantalum-nitride resistor technology for phosphide-based optoelectronics," M. L. Lovejoy, et al., Thin Solid Films 290–291 (1996), pages 513–517, because the present invention uses both photoresist layer 102 and second photoresist layer 112 to aid in defining the thin film pattern, unlike Lovejoy which uses the first photoresist layer to merely cover up devices already made on the wafer. As such, etching process times are reduced, and more precise thin film patterns are possible.

Further, the present invention does not require highly advanced photolithography techniques, nor does the present invention require a large number of processing steps to produce thin film devices on sensitive devices such as HEMTs and HBTs. As such, the present invention allows for a higher yield of thin film devices because of the increased reliability of the metallization step coverage and because of the relatively low number of processing steps required.

The present invention also allows for the layer 110 to be up to seventy percent thinner than in the related art, i.e., step height 118 can be smaller, because the device that deposited layer 116 comprises is only one material, e.g., TaN, not TaN and SiN.

Although described above with respect to HEMT and HBT technologies, the present invention is applicable to all semiconductor devices, because the photoresist described in photoresist layers 102 and 112 is used with other types of devices. Further, although discussed primarily with respect to thin film resistors, layer 110 can also produce other thin film devices or layers. The method of the present invention can also be applied several times in a serial fashion to produce a stack of deposited films, by repeating the photoresist protection of multiple layers 110.

Experimental Results and Simulations

Figure 1A:
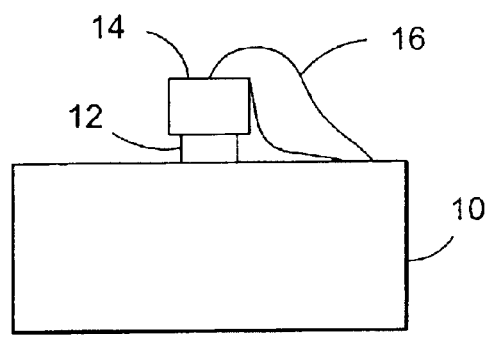
FIGS. 1A–1B illustrate a tantalum nitride (TaN)/silicon nitride (SiN) resistor stack of the related art.
Figure 1B:
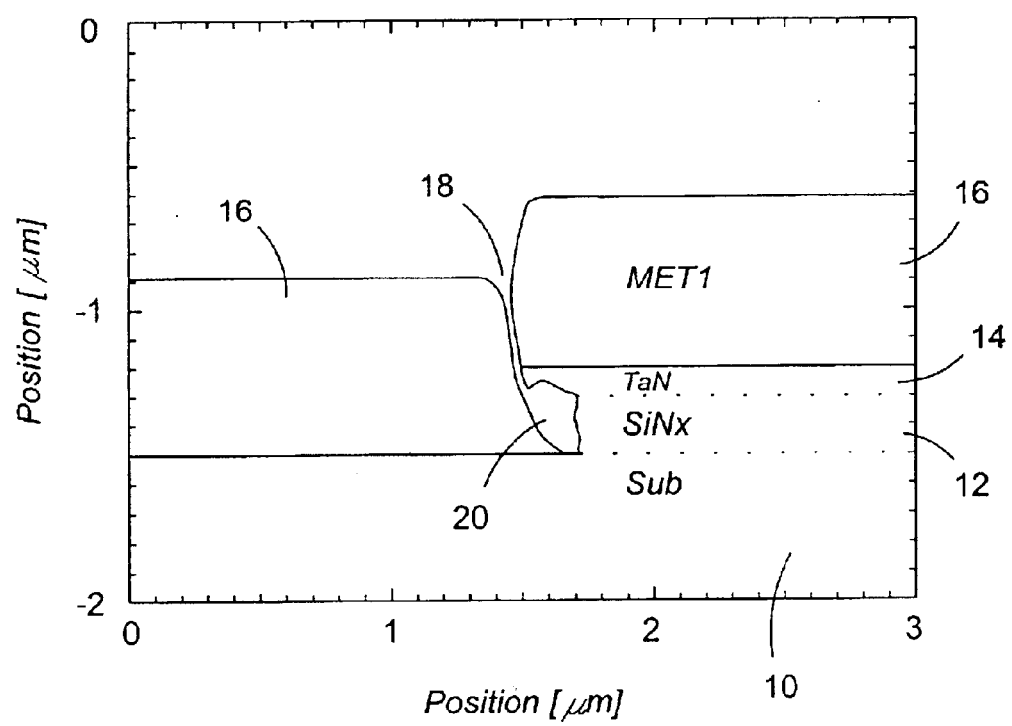
Figure 3:
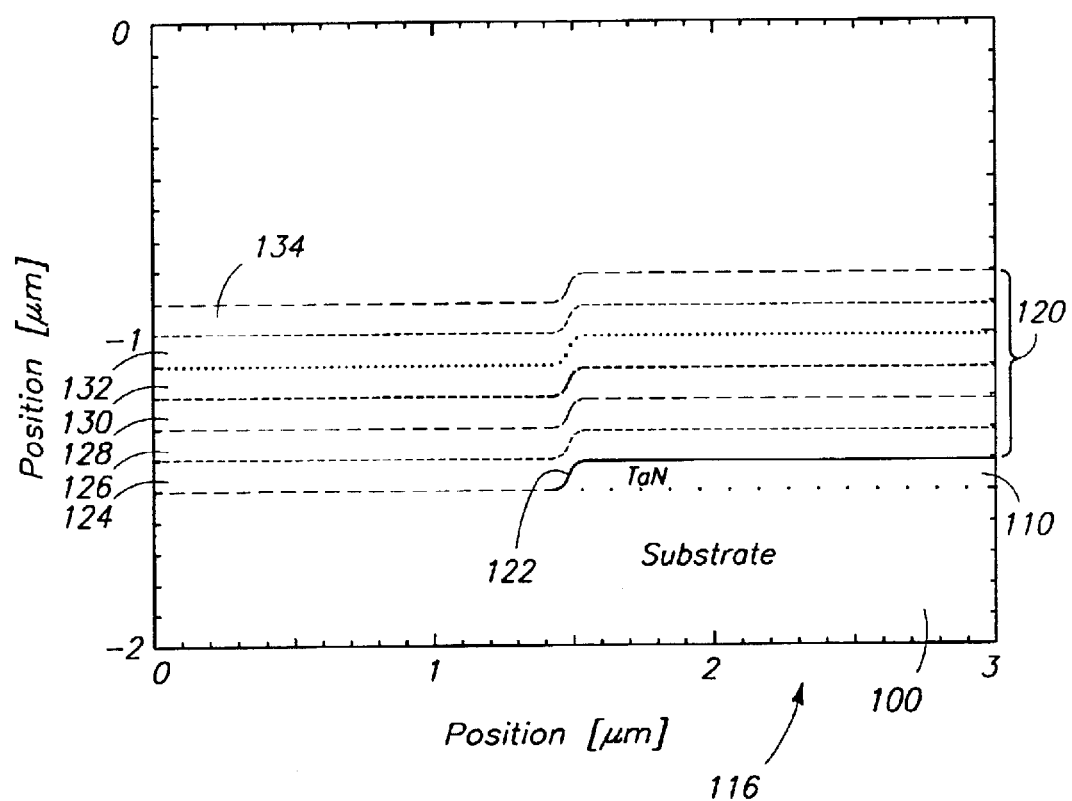
FIG. 3 illustrates a simulated cross-section of the interconnect and thin film edge of the present invention.

FIG. 3 illustrates a simulated cross-section of the interconnect and thin film edge of the present invention. The device 116, with first layer 100 and layer 110, is shown in cross-section with a metallization layer 120. The simulation of the interface 122 is performed using a software tool called "Technology Computer Aided Design," written at the University of California, Berkeley, and is calibrated by the actual cross section of a SiN/TaN thin film device as described with respect to FIG. 1B. Examples of software design tools that are commercially available include ATHENA, available from SILVACO, DIOS, available from ISE Corp., and TSUPREM-4 available from AVANT! Corp. Iso-contours 124–134 of 900 Angstrom thickness within metallization layer 120 show that there are no voids within metallization layer 120 at interface 122, which shows that the present invention provides good step coverage between the layer 110 and the metallization layer 120. The simulation shown in FIG. 3 correlates closely with actual devices manufactured using the present invention as illustrated in FIG. 4.

Figure 4:
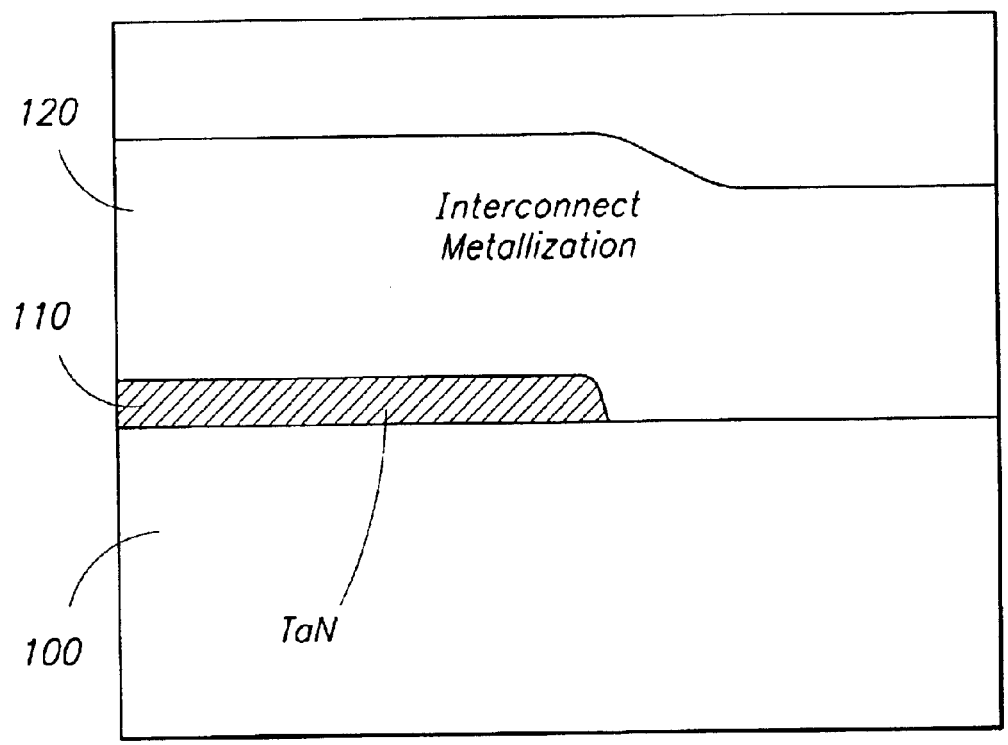
FIG. 4 is an illustration of a scanning electron micrograph (SEM) of a cross-section of a resistor edge and metal interconnect prepared using the present invention.

FIG. 4 is an illustration of a scanning electron micrograph (SEM) of a cross-section of a resistor edge and metal interconnect prepared using the present invention.

The contour of layer 110 and the contour of metallization layer 120 shown in FIG. 4 illustrate that a device made in accordance with the present invention shows no undercutting of layer 110, and, as such, no stress points on metallization layer 120 which can produce breakage.

Process Chart

Figure 5:
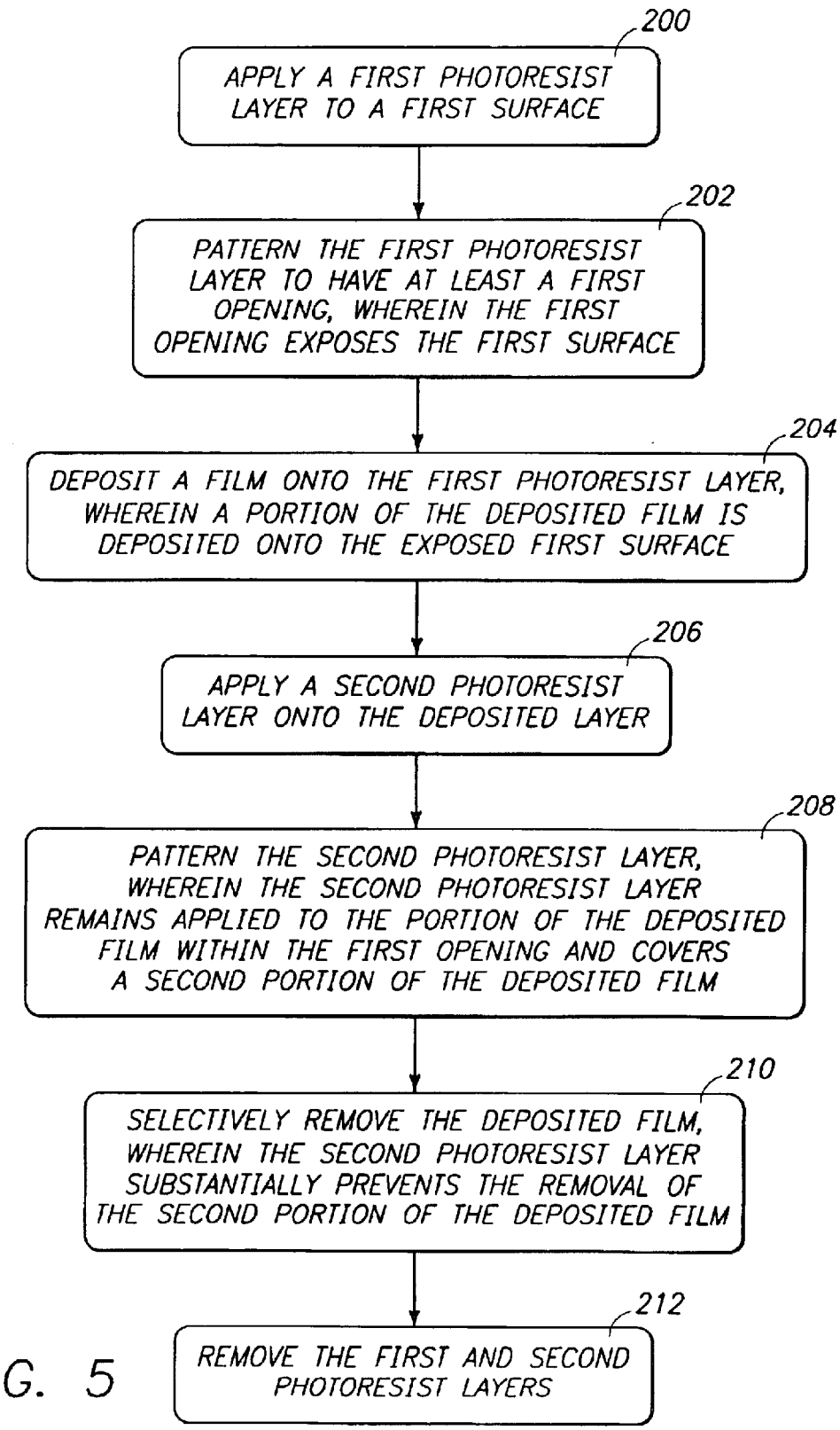
FIG. 5 is a flow chart showing the operations used to practice one embodiment of the present invention.

FIG. 5 is a flow chart showing the operations used to practice one embodiment of the present invention.

Block 200 represents performing the step of applying a first photoresist layer to a first surface.

Block 202 represents performing the step of patterning the first photoresist layer to have at least a first opening in the first photoresist layer, wherein the first opening exposes the first surface.

Block 204 represents performing the step of depositing a film onto the first photoresist layer, wherein a portion of the deposited film is deposited onto the exposed first surface.

Block 206 represents performing the step of applying a second photoresist layer onto the deposited layer.

Block 208 represents performing the step of patterning the second photoresist layer, wherein the second photoresist layer remains applied to the portion of the deposited film within the first opening and covers a second portion of the deposited layer.

Block 210 represents performing the step of selectively removing the deposited layer, wherein the second photoresist layer substantially prevents the removal of the second portion of the deposited layer, wherein the first photoresist layer and the second photoresist layer assist in the defining of the deposited layer.

Block 212 represents performing the step of removing the first photoresist layer and the second photoresist layer, therein exposing the first surface and the second portion of the deposited layer, wherein the first photoresist layer and the second photoresist layer assist in the defining of the deposited layer.

A device in accordance with the present invention uses both photoresist layers to define the pattern of the deposited film. The Lovejoy reference uses the first photoresist layer merely to protect any underlying device. By using the two photoresist layers to define the deposited film, more accurate contours of the film can be produced, as well as providing smaller undercutting of the thin film by reducing the areas of the film exposed to the etchant. Further, etching times are reduced, which reduces the risk of damage to other devices that are resident on the same substrate as the thin film device. Thus, a device made in accordance with the present invention will have better performance characteristics and more predictable operational response, than devices in the related art.

The device of the present invention can also have multiple thin film layers by using two photoresist layers to define the pattern of each thin film layer of the final device. The layers can be patterned such that the thin film deposited first is patterned first, or patterned later than, subsequently deposited thin film layers.

In summary, the present invention describes a device and a method for making a thin film device. A method in accordance with the present invention comprises the steps of applying a first photoresist layer to a first surface, and patterning the first photoresist layer to have at least a first opening that exposes the first surface. A film is deposited onto the first photoresist layer, wherein a portion of the deposited film is deposited onto the exposed first surface. A second photoresist layer is applied onto the deposited layer, wherein the second photoresist layer is applied to the portion of the deposited film within the first opening and covers a second portion of the deposited layer. The deposited layer, first photoresist layer, and second photoresist layer are selectively removed, therein exposing the first surface and the second portion of the deposited layer.

A device in accordance with the present invention comprises a device formed within a semiconductor structure and a deposited film, coupled to the device. The deposited film is directly coupled to a first surface of a semiconductor wafer, wherein the semiconductor wafer contains the semiconductor structure, and the deposited film is defined by a first photoresist layer and a second photoresist layer. The first photoresist layer limits the coupling of the deposited film to the first surface, and the second photoresist layer defines a pattern of the deposited film.

The foregoing description of the preferred embodiment of the invention has been presented for the purposes of illustration and description. It is not intended to be exhaustive or to limit the invention to the precise form disclosed. Many modifications and variations are possible in light of the above teaching. For example, the process can be repeated to create a two layer thin film device if desired. It is intended that the scope of the invention be limited not by this detailed description, but rather by the claims appended hereto.

What is claimed is:

1. A method for fabricating a thin film device, comprising the steps of:
    applying a first photoresist layer to a first surface;
    patterning the first photoresist layer to have at least a first opening in the first photoresist layer, wherein the first opening exposes the first surface;
    depositing a film onto the first photoresist layer, wherein a portion of the deposited film is deposited onto the exposed first surface;
    applying a second photoresist layer onto the deposited layer;
    patterning the second photoresist layer, wherein the second photoresist layer remains applied to the portion of the deposited film within the first opening and covers a second portion of the deposited layer;
    selectively removing the deposited layer, wherein the second photoresist layer substantially prevents the removal of the second portion of the deposited layer, wherein the first photoresist layer and the second photoresist layer assist in the defining of the deposited layer;
    removing the first photoresist layer and the second photoresist layer, therein exposing the first surface and the second portion of the deposited layer;
    applying a third photoresist layer;
    patterning the third photoresist layer to have at least a second opening in the third photoresist layer;
    depositing a second film onto the third photoresist layer, wherein a portion of the deposited second film is deposited within the second opening;
    applying a fourth photoresist layer onto the deposited layer;
    patterning the fourth photoresist layer, wherein the fourth photoresist layer remains applied to the portion of the deposited second film within the second opening and covers a second portion of the deposited second layer;
    selectively removing the deposited second layer, wherein the fourth photoresist layer substantially prevents the removal of the second portion of the deposited second layer, wherein the third photoresist layer and the fourth photoresist layer assist in the defining of the deposited second layer; and
    removing the third photoresist layer and the fourth photoresist layer.

2. The method of claim 1, wherein the deposited film comprises a thin film resistor.

3. The method of claim 1, wherein the deposited film is comprised of a material selected from a group comprising tantalum nitride, aluminum, silicon dioxide, nickel chromium, tungsten silicide, tungsten, and silicon nitride.

4. The method of claim 1, wherein the first photoresist layer protects a device on the first surface.

5. The method of claim 4, wherein the first surface comprises at least a portion of a high electron mobility device.

6. The method of claim 4, wherein the first surface comprises at least a portion of a heterojunction bipolar transistor.

7. The method of claim 1, wherein the deposited second film is selectively removed before the deposited film is selectively removed.

8. The method of claim 1, wherein the step of patterning the first photoresist layer and the step of patterning the second photoresist layer are performed using a single mask.

9. A method for fabricating a thin film device, comprising the steps of:
    applying a first photoresist layer to a first surface, wherein the first photoresist layer protects a device on the first surface;
    patterning the first photoresist layer to have at least a first opening in the first photoresist layer, wherein the first opening exposes the first surface;
    depositing a film onto the first photoresist layer, wherein a portion of the deposited film is deposited onto the exposed first surface;
    applying a second photoresist layer onto the deposited layer;
    patterning the second photoresist layer, wherein the second photoresist layer remains applied to the portion of the deposited film within the first opening and covers a second portion of the deposited layer;
    selectively removing the deposited layer, wherein the second photoresist layer substantially prevents the removal of the second portion of the deposited layer, wherein the first photoresist layer and the second photoresist layer assist in the defining of the deposited layer; and
    removing the first photoresist layer and the second photoresist layer, therein exposing the first surface and the second portion of the deposited layer.

10. The method of claim 9, wherein the deposited film comprises a thin film resistor.

11. The method of claim 9, wherein the deposited film is comprised of a material selected from a group comprising tantalum nitride, aluminum, silicon dioxide, nickel chromium, tungsten silicide, tungsten, and silicon nitride.

12. The method of claim 9, wherein the first surface comprises at least a portion of a high electron mobility device.

13. The method of claim 9, wherein the first surface comprises at least a portion of a heterojunction bipolar transistor.

14. The method of claim 9, further comprising the steps of:
    applying a third photoresist layer;
    patterning the third photoresist layer to have at least a second opening in the third photoresist layer;
    depositing a second film onto the third photoresist layer, wherein a portion of the deposited second film is deposited within the second opening;
    applying a fourth photoresist layer onto the deposited layer;
    patterning the fourth photoresist layer, wherein the fourth photoresist layer remains applied to the portion of the deposited second film within the second opening and covers a second portion of the deposited second layer; and selectively removing the deposited second layer, wherein the fourth photoresist layer substantially prevents the removal of the second portion of die deposited second layer, wherein the third photoresist layer and the fourth photoresist layer assist in the defining of the deposited second layer; and removing the third photoresist layer and the fourth photoresist layer.

15. The method of claim 14, wherein the deposited second film is selectively removed before the deposited film is selectively removed.

16. The method of claim 9, wherein the step of patterning the first photoresist layer and the step of patterning the second photoresist layer are performed using a single mask.

\* \* \* \* \*